(12) United States Patent  (10) Patent No.: US 8,271,226 B2
Chakravadhanula et al.  (45) Date of Patent: Sep. 18, 2012

(54) TESTING STATE RETENTION LOGIC IN LOW POWER SYSTEMS

(75) Inventors: Krishna Chakravadhanula, Vestal, NY (US); Patrick Gallagher, Apalachin, NY (US); Vivek Chickermane, Ithaca, NY (US); Steven L. Gregor, Owego, NY (US); Puneet Arora, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 495 days.

(21) Appl. No.: 12/147,428

(22) Filed: Jun. 26, 2008

(65) Prior Publication Data

US 2009/0326854 A1    Dec. 31, 2009

(51) Int. Cl.
*G06F 3/00* (2006.01)
*G06F 3/01* (2006.01)
*G06F 3/06* (2006.01)
*G06F 13/10* (2006.01)

(52) U.S. Cl. ......... 702/119; 702/117; 702/118; 702/123

(58) Field of Classification Search .............. 702/57, 702/83, 85, 92, 107, 119, 176, 181, 188, 702/189; 365/185.03, 201, 226; 703/14; 716/4

See application file for complete search history.

(56) References Cited

U.S. PATENT DOCUMENTS

| | | | |
|---|---|---|---|
| 7,735,030 B1 * | 6/2010 | Kalil et al. | 716/136 |
| 7,739,629 B2 * | 6/2010 | Wang et al. | 716/136 |
| 7,747,971 B1 * | 6/2010 | Chopra et al. | 716/136 |

* cited by examiner

*Primary Examiner* — Michael Nghiem
*Assistant Examiner* — Felix Suarez
(74) *Attorney, Agent, or Firm* — Schwegman Lundberg & Woessner, P.A.

(57) ABSTRACT

A method of testing an Integrated Circuit (IC) includes: loading a sequence of data into a chain of circuit elements that hold data values, where outputs of at least some circuit elements are connected to inputs of adjacent circuit elements so values move sequentially through the chain between a chain input for loading values and a chain output for unloading values, and a first circuit element includes a retention element for saving values during power variations related to the IC. The method further includes: saving a value from the data sequence in the retention element; and accessing the retention element for verifying an accuracy of the saved value from the data sequence.

23 Claims, 5 Drawing Sheets

TESTING STATE RETENTION LOGIC IN LOW POWER SYSTEMS

BACKGROUND OF THE INVENTION

1. Field of Invention

The present invention relates to integrated circuits (ICs) generally and more particularly to low-power IC systems.

2. Description of Related Art

IC Designs with multiple power domains are becoming increasingly common since power consumption can be reduced by temporarily powering off regions of the chip (called domains) that do not need to be active. Such designs have one or more switchable power domains and these domains can be powered off to eliminate both static and dynamic power dissipation in them. In order to ensure that the domain powers back on into a known state, switchable domains may include state retention cells (e.g., circuit elements that include retention elements for saving state values during power variations). Typically, state retention cells contain special flops or latches to retain the state of the cell when its main power supply is shut off. See, for example, U.S. Pat. Nos. 6,775,180, 7,091,766, 7,123,068, 7,164,301, 7,183,825, and 7,138,842, each of which is incorporated by reference herein in its entirety.

State retention cells, which are also called State Retention Power Gating or SRPG cells in some contexts, must be tested during manufacturing test to ensure that they are functioning correctly. An SRPG cell must be capable of retaining data when power is turned off to its enclosing domain, and the retained data must be observable once power is turned back on. In this context, a domain is considered switched off when the ambient voltage is lower than the operating voltage of the domain so that the ambient voltage does not necessarily have to be at 0V for the domain to be switched off.

But the tests currently generated by Automatic Test Pattern Generation (ATPG) tools generally do not target the retention capabilities of the SRPG cells. In general, these tests target only structural defects (net stuck at logic-0 value, etc.) in the chip, and do not try to test the functional behavior of the logic including, for example, cycling of the power domains (e.g., turning them off and back on) containing the SRPG cells to see whether the cells are retaining state or not. See, for example, U.S. Pat. No. 7,065,724, which is incorporated by reference herein in its entirety.

Hence there is a need to test SRPG cells using a 'functional' approach that will involve testing the state retention capability of the SRPG in addition to testing just for structural defects. More generally there is a need for improved testing of ICs with retention elements for saving values during power variations related to the ICs.

SUMMARY OF THE INVENTION

In one embodiment of the present invention, a method of testing an Integrated Circuit (IC) includes: loading a sequence of data into a chain of circuit elements that hold data values, where outputs of at least some circuit elements are connected to inputs of adjacent circuit elements so values move sequentially through the chain between a chain input for loading values and a chain output for unloading values, and a first circuit element (e.g., any one of the circuit elements) includes a retention element for saving values during power variations related to the IC. The method further includes: saving a value from the data sequence in the retention element; and accessing the retention element for verifying an accuracy of the saved value from the data sequence.

According to one aspect of this embodiment, accessing the retention element may include using the retention element to restore a value for the first circuit element; and unloading values from the chain of circuit elements.

According to another aspect, the method may further include transitioning a portion of the IC to a power-off mode before accessing the retention element, where the portion of the IC includes the retention element.

According to another aspect, the data sequence may be a first data sequence and the method may further include: loading a second sequence of data into the chain after saving the value in the retention element and before accessing the retention element, where the second data sequence includes a value for the retention element that is different from a corresponding value of the first data sequence. Additionally, with respect to this aspect, each of the first and second sequences may include substantially uniform values for reducing a power consumption corresponding to the method.

According to another aspect, the data sequence may be a first data sequence and the method may further include: loading a second sequence of data into the chain after accessing the retention element for verifying the accuracy of the saved value from the first data sequence, where the second data sequence includes a value for the retention element that is different from the saved value of the first data sequence; saving the different value from the second data sequence in the retention element; and accessing the retention element for verifying an accuracy of the saved different value from the second data sequence. Additionally, with respect to this aspect, each of the first and second sequences may include substantially uniform values for reducing a power consumption corresponding to the method.

According to another aspect, the retention element may include: a flip-flop or latch for storing values, and a power source independent of the power variations related to the IC.

According to another aspect, loading the sequence of data into the chain of circuit elements may include a set operation or reset operation for at least one circuit element. That is, in addition to loading values at the chain input, one or more circuit elements can be loaded directly by a set operation (e.g., to value 1) or reset operation (e.g., to value 0).

According to another aspect, multiple circuit elements in the chain may each include a retention element for saving values during power variations related to the IC, and the method may further include: saving values from the data sequence in the retention elements; and accessing the retention elements for verifying an accuracy of the saved values from the data sequence. Additionally, with respect to this aspect, features described above with respect to a single retention element may be applied to multiple retention elements.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer.

In these ways the present invention enables improved testing of ICs with retention elements for saving values during power variations related to the ICs

DETAILED DESCRIPTION OF EXEMPLARY EMBODIMENTS

Figure 1:
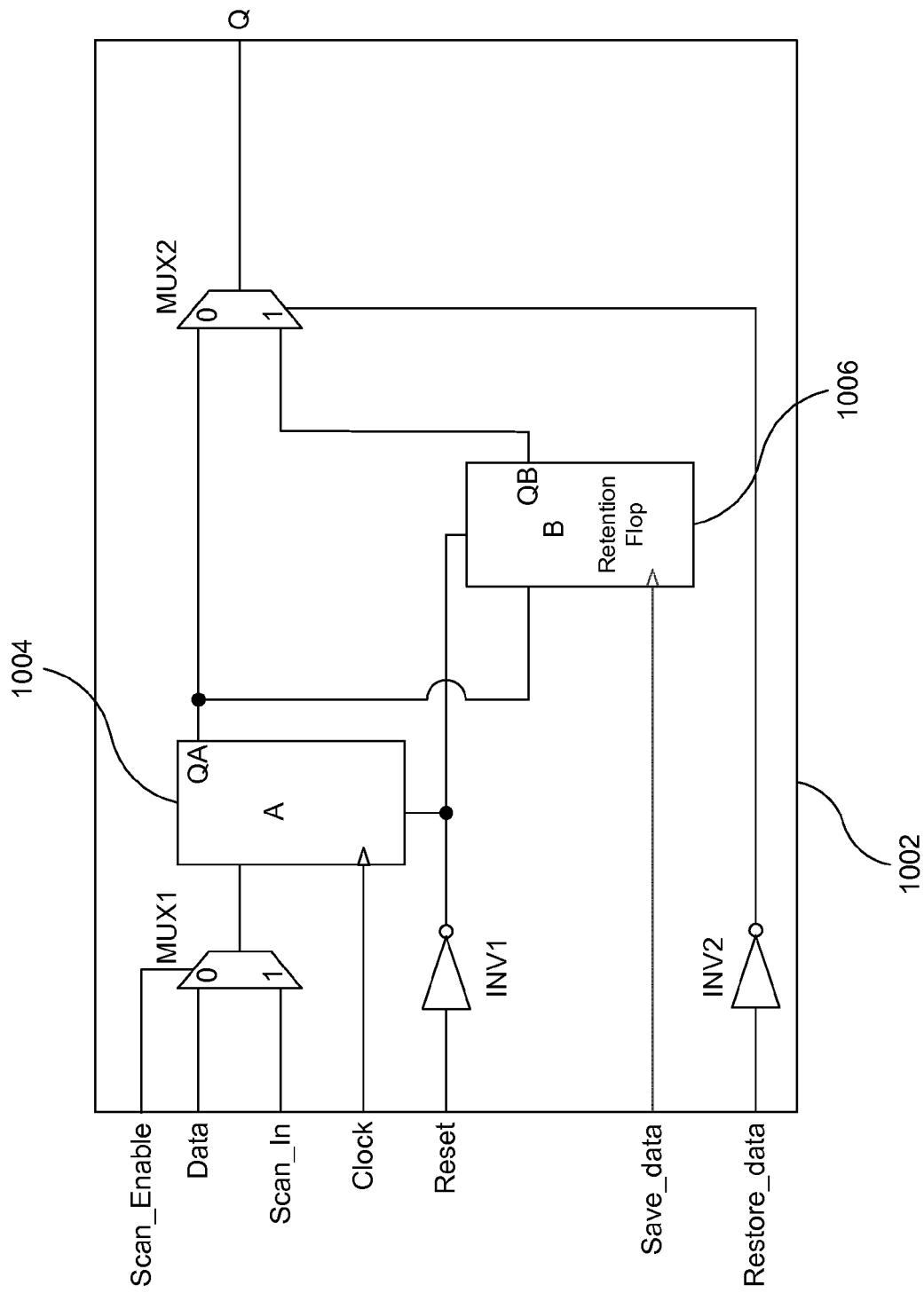
FIG. 1 shows an exemplary state retention cell (or SRPG cell).

FIG. 1 shows an exemplary state retention cell (or SRPG cell) 1002 that includes two flip-flops or "flops" (functional flop A 1004 and retention flop B 1006), two multiplexors (MUX1 and MUX2), and two inverters (INV1 and INV2). Multiplexor MUX1 controls whether Flop A gets data from the functional path (through pin Data) or from the previous flop in the scan chain (through pin Scan_In). When pin Scan_Enable is at logic-0 value, Flop A is on the functional path (Data-Q) and when Scan_Enable is at logic-1 value Flop A is on the scan path (Scan_In-Q). The Restore_data pin would typically be at logic-1 unless the value in Flop B needs to be made visible outside the retention cell.

Flop B 1006 is the retention flop (or retention element) and is intended to hold state when the main power supply to the retention cell is shut off. Once Flop A 1004 is loaded with an initial state either through the functional pin Data or through the scan pin Scan_In, the Save_data pin is pulsed to ensure the retention flop is loaded with the same state. After the save operation, the power to the parent domain can be turned off. When power is restored, Flop A may come back up in an unknown state. Therefore, the Restore_data pin needs to be at a low value for the stored state to be observable at downstream logic via the Q pin.

Existing methods test the retention cell 1002 by performing test generation for structural defects and treating the cell as any other logic within the chip. Some examples of structural defects are pin QB on Flop B 1006 being incorrectly connected to the ground rail, output pin of MUX2 being connected to the power rail, etc. A typical structural testing approach would be to make flop A 1004 in FIG. 1 part of a scan chain while flop B 1006 would be treated as a non-scan flop. Common fault models like stuck-at and transition faults are then used to estimate coverage of defects. For example, the manufacturing defects mentioned earlier would be similar to pin QB having a stuck-at-0 fault and output pin of MUX2 having a stuck-at-1 fault. These faults related to manufacturing defects are also called static faults while faults that involve timing delays are called dynamic faults. See, for example, U.S. Pat. No. 5,546,408, which is incorporated by reference herein in its entirety.

But thorough coverage of static faults in the testing of the retention cell 1002 does not guarantee its correct operation. It is possible that even though there is no static defect, once the cell 1002 is powered down and subsequently restored, the restore capability may not be working correctly. Similar considerations apply for dynamic faults as well. For example, it is possible that the noise from turning the power grid off and on may cause the retention logic to lose state values.

Figure 2:
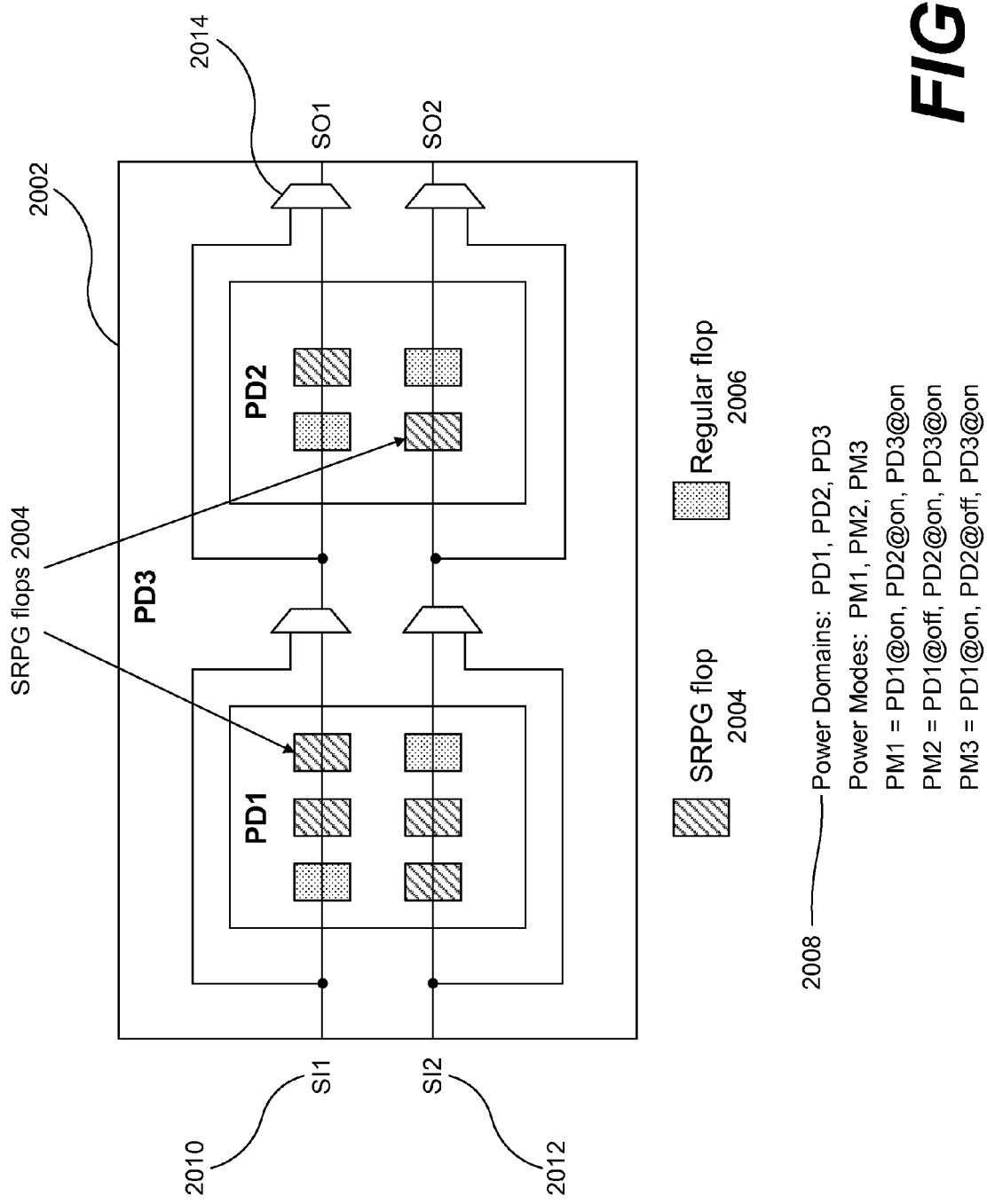
FIG. 2 shows an exemplary IC design that includes multiple circuit elements including state retentions cells as illustrated in FIG. 1.

FIG. 2 shows an exemplary IC (integrated circuit) 2002 that includes multiple circuit elements including SRPG flops 2004 that each include a retention element and regular flops 2006 (e.g., conventional flops without retention elements).

The design in FIG. 2 is partitioned into three power domains (PD1, PD2, PD3) 2008. A power domain is a collection of instances in the design that use the same power supply during normal operation and that can be switched on or off at the same time. The design has three power modes (PM1, PM2, PM3), where a power mode is a static state of the design in which each power domain operates at a specific nominal condition. For example, in power mode PM2 in the example below, power domain PD1 is switched off, while domains PD2 and PD3 are switched on. The SRPG flops 2004 in the example are also shown, and they are distributed among the two scan chains in the design, a first scan chain 2010 (SI1-SO1) and a second scan chain 2012 (SI2-SO2). Four muxes 2014 are also included for bypassing power domains that are powered off from the rest of the system (e.g., for ensuring predictability). For example, when power domain PD2 is off, the two right-most muxes 2014 can be used to bypass this power domain in the scan chains 2010, 2012.

In this example, PD1 includes four SRPG flops, PD2 includes two SRPG flops, and PD3 includes six SRPG flops. In either of these power domains, the SRPG flops could be labeled arbitrarily as a first SRPG, a second SRPG, etc. Note that the words first and second are used here and elsewhere for labeling purposes only and are not intended to denote any specific spatial or temporal ordering. Furthermore, the labeling of a first element does not imply the presence a second element.

The generation of tests for SRPGs 2004 involves transitioning across power modes of the IC 2002. To test the SRPG cells within a power domain (e.g., domain PD1), the SRPGs must first be loaded (e.g., data scanned in at the input pins SI1, SI2) with initial values during a power mode containing that domain in a powered-on state (e.g., mode PM1, PD1 is on). The domain is then powered off by transitioning to a power mode with the domain in its off state (e.g., mode PM2, PD1 is off). This transition may involve multiple clock cycles or latency times as specified by the user or the other system requirements. For example, the IC 2002 may be required to stay in the new power mode for a specific period of time before transitioning. Finally, the system is transitioned back to the initial power mode or to a mode where the domain of interest is powered back (e.g., mode PM1, PD1 is on). The saved SRPG values are then unloaded (e.g., scanned out at the output pins SO1, SO2) and compared against the previously scanned in values.

Figure 3:
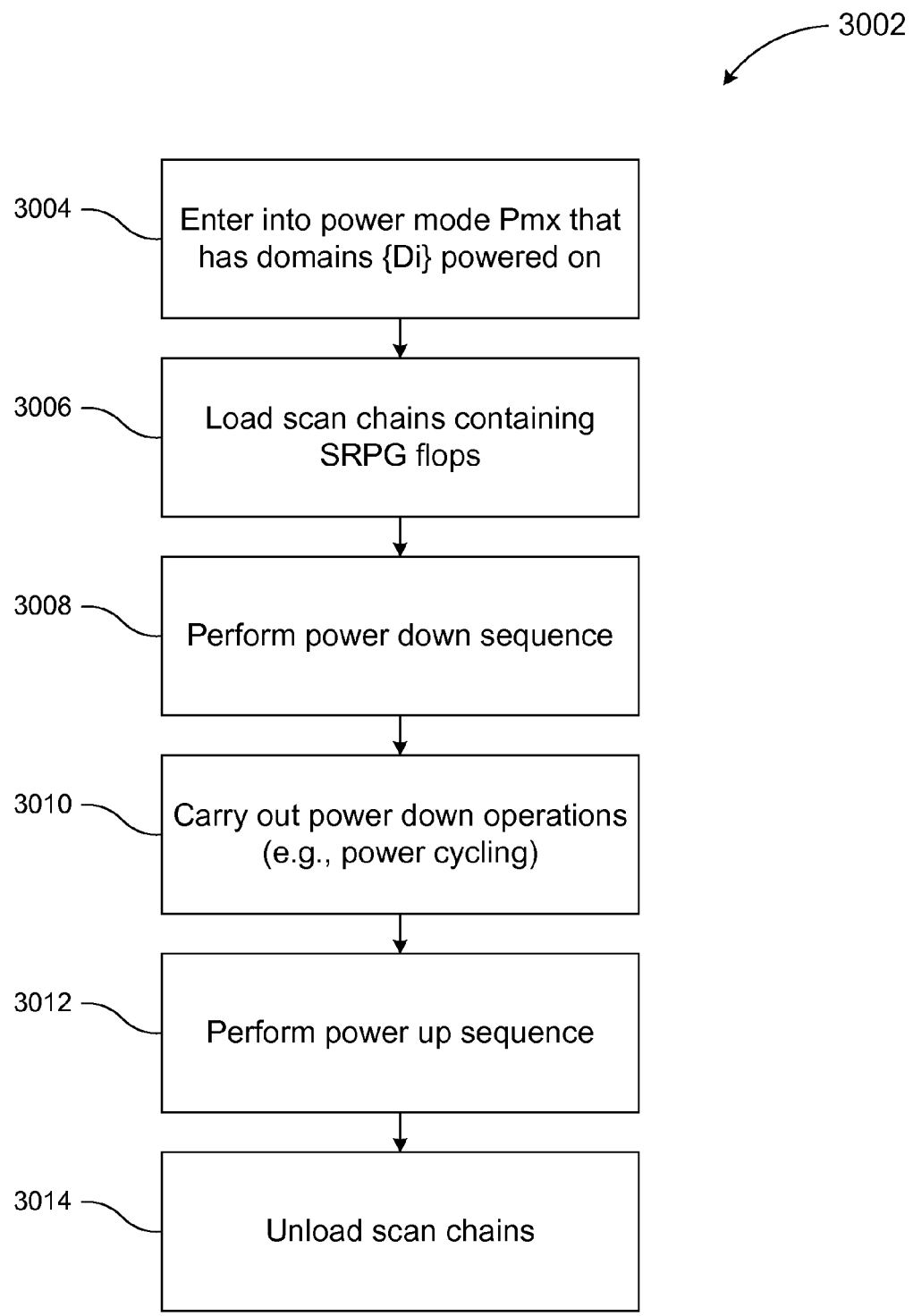
FIG. 3 shows a method for testing retention cells according to an embodiment of the present invention.

FIG. 3 shows an exemplary method 3002 for testing the SRPG flops 2004 in the IC 2002 according to an embodiment of the present invention. The method is directed towards SRPGs 2004 present within a set of power domains {Di} 2008, where these domains are powered on in Power Mode PMx and off in Power Mode PMy.

In the first step 3004 of the method 3002, enter into power mode PMx that has domains {Di} 2008 powered on. In the next step 3006, scan-in known values into a scan chain 2010, 2012 containing SRPG flops. In the next step 3008, perform a power down sequence (transition to power mode PMy that has {Di} turned off). This step 3008 includes isolating the on domains from the domains being turned off, performing a retention save of the value loaded into the SRPG cell, and powering down domains {Di}. Note that isolating the on domains is optional and generally includes eliminating unpredictable values from pins on switchable power-domain boundaries (e.g., by using value-setting elements in the scan chains at exit points of power domains, not shown in FIG. 2).

In the next step 3010, the power down operations can include a period of time where the power is off or alternatively where some power cycling or power variations occur. In the next step 3012, perform a power up sequence (e.g., transition back to PMx or to power mode that has {Di} turned on). This step 3012 includes powering up domains {Di}, performing a restore of the value saved into the SRPG cell, and deactivating isolation logic (e.g., at exit points of power domains, not shown in FIG. 2). In the next step 3014, unload the scan chains 2010, 2012 to ensure that the SRPG flops 2004 were able to retain saved values. Typically values of the regular flops 2006 are ignored in this test, but they may be examined also if they are expected to hold predictable values.

The method 3002 above only indicates the logical steps that would be involved in generating tests for SRPGs 2004. Depending on the retention-element design style, intermediary steps like retention save, restore, etc. may be more complicated. For example, some design styles do not have a save signal (e.g., Save_data in FIG. 1), so the 'retention save' step (e.g., as part of the power down sequence 3008) is either removed or replaced with something equivalent. Furthermore, some design styles may not have any explicit control signal for functions related to "retention save" and "restore."

Note that an SRPG 2004 can be tested in this way as long as its values can be transferred to and from a chain of circuit elements that can be loaded and unloaded with a sequence of data values. In some operational settings this might require additional steps of transferring data values to and from a retention element that is part of a circuit element. Also, in some operational settings, values can be directly loaded into circuit elements (e.g., SRPGs 2004 or conventional flops 2006) by a set operation (to value 1) or a reset operation (to value 0), typically by pins specifically directed to these operations.

Figure 4:
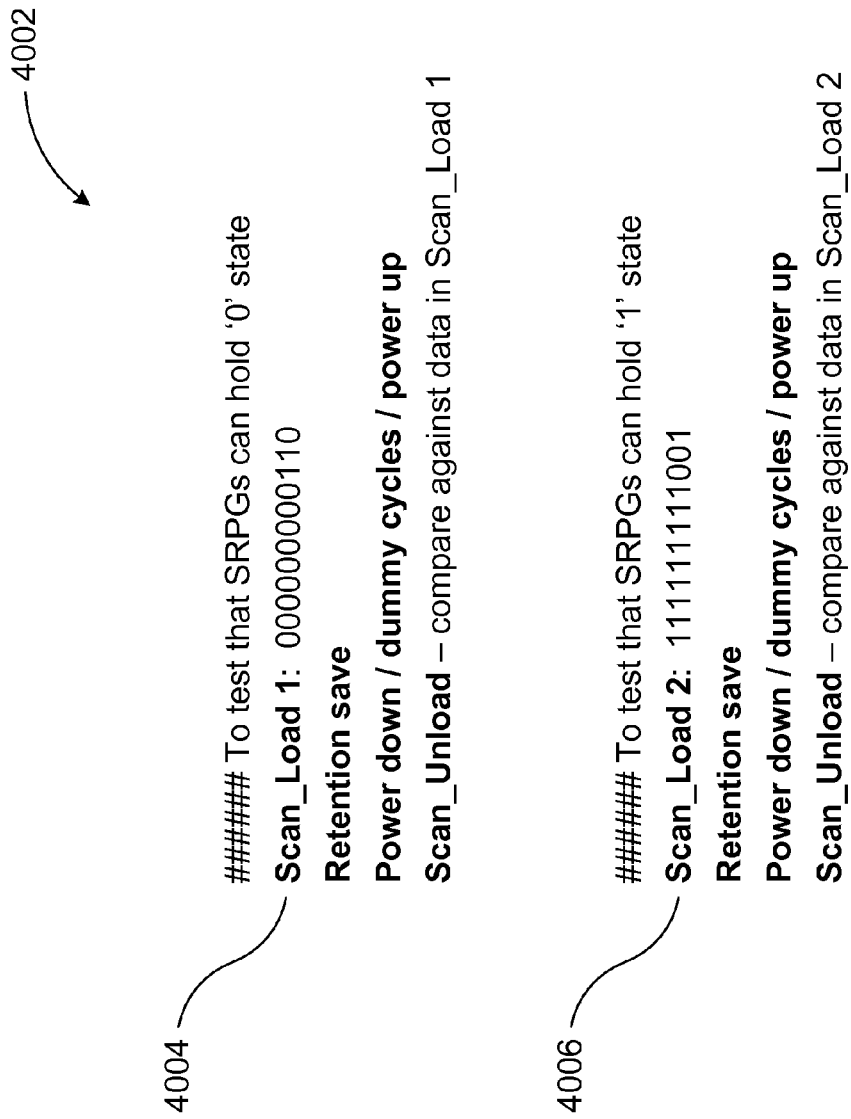
FIG. 4 shows another method for testing retention cells according to an embodiment of the present invention.

In general, since the SRPG cell 2004 must be capable of retaining both a 0 value and a 1 value, at least two patterns are used to the retention capabilities of all the SRPGs within a domain. More patterns may be needed to test the SRPGs in the entire design. FIG. 4 shows a method 4002 according to an embodiment of the present invention where two 12-bit patterns are used (e.g., as in the scan-in step 3006 of the more generally described method 3002). A first 12-bit long scan chain pattern 4004 with mostly 0s is loaded, followed by state retention, power cycling and unloading (e.g., as in FIG. 3). Then a second 12-bit long scan chain pattern 4006 with mostly 1s is loaded, followed by state retention, power cycling and unloading. Any errors detected while comparing the unloaded data against the loaded values will indicate problems with the retention logic. During the scan unload process, comparison will generally be done for only those bits in the chain that are SRPG cells. The values in other bits of the chain can be ignored since they may be at an indeterminate state after power-up operations are completed.

Three aspects of the scan-chain patterns 4004, 4006 are notable. First, both a 0 value and a 1 value are tested for each SRPG cell since the patterns have complementary values for each location. Secondly, by including some variation in the patterns (e.g., not identically 0s or 1s), the scan chain patterns test for errors related to transitions in the scan chain pattern. Thirdly, each sequence has substantially uniform values (e.g., mostly 0s or mostly 1s) so that relatively few transitions are encountered in scan test and power consumption is reduced.

Each of the patterns 4004, 4006 can be described as a low-power scan-chain test. For example, first pattern 4004 not only allows for SRPG testing, but the presence of the '0110' bits allows for all possible transitions through the scan chain bits. Existing scan chain test patterns typically consist of repeating strings of '0110', resulting in a pattern that looks like '011001100110' and which can cause excessive power consumption.

Figure 5:
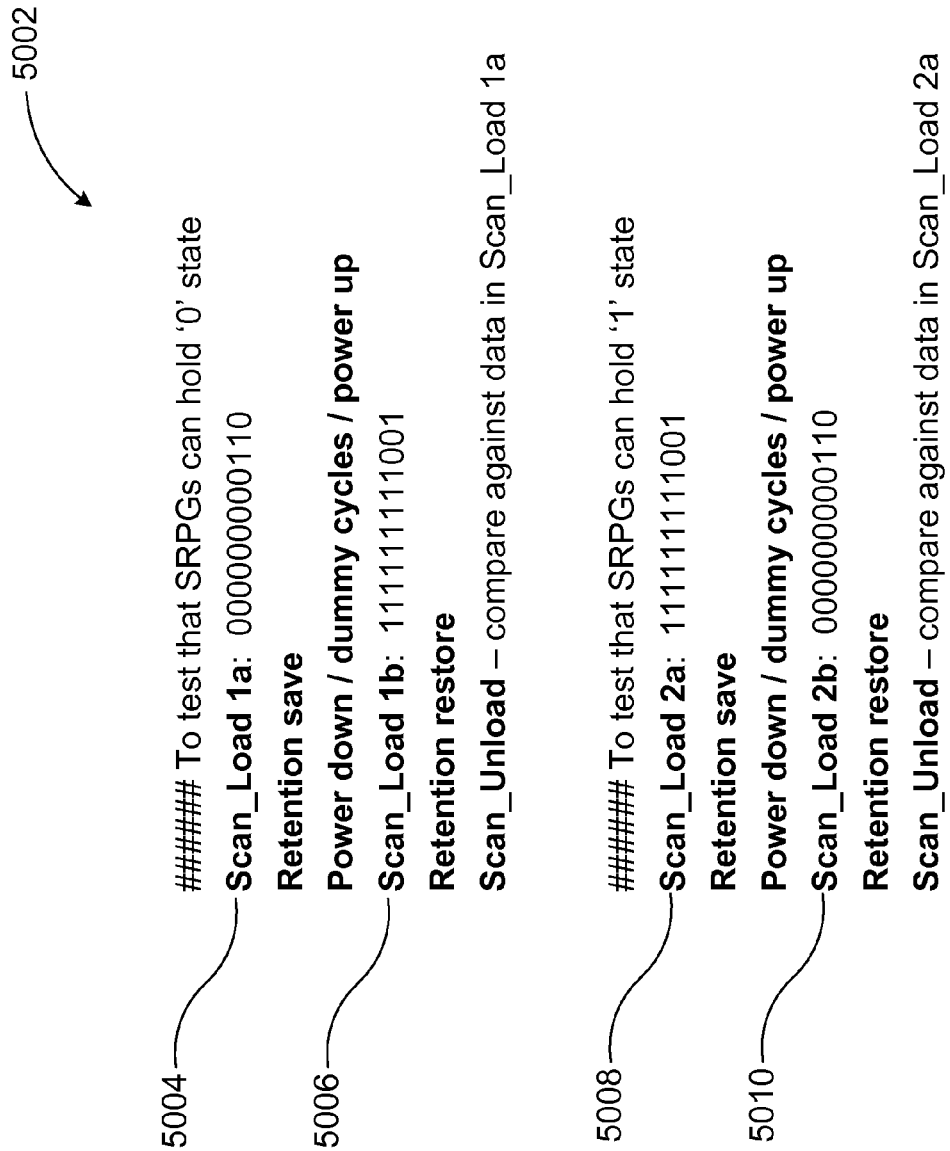
FIG. 5 shows another method for testing retention cells according to an embodiment of the present invention.

This method 4002 may not however detect a fault in the retention logic when the functional flop 1004 powers up to the same state as the retention flop 1006. FIG. 5 shows a method 5002 according to an embodiment of the present invention where two additional 12-bit patterns are loaded. A first 12-bit long scan chain pattern 5004 with mostly 0s is loaded, followed by state retention, and power cycling. Then a complementary pattern 5006 with mostly 1s is loaded, followed by restoring the retention value and unloading the scan chain. Then a second 12-bit long scan chain pattern 5008 with mostly is loaded (here identical to the above complementary pattern 5006), followed by state retention, and power cycling. Then as in then first part of the test, a complementary pattern 5010 with mostly 0s is loaded (here identical to the above pattern 5004), followed by restoring the retention value and unloading the scan chain.

This method 5002, which is be applicable in cases where SRPG cells 1002 included functional flops 1004 that can be loaded independently of the retention flops 1006, desirably detects errors that the previously described method 4002 might miss. Modifications of both methods 4002, 5002 may be desirable depending on the requirements of the operational setting. For example, a user input may be use to control the number of patterns used and the degree of variation within each pattern (e.g., number of repetitions for an input string). Additionally, if each functional flop has a reset or set pin, then this pin could be used instead of loading the two additional patterns 5006, 5010 although this would generally mean that all functional flops would be reset or set to the same value.

Other operational considerations may involve stress on the power grid. For example, during the restoring of retained states in a large system, the power grid may be undesirably stressed when all the retention cells restore at the same time. To avoid this problem, the restore signals (e.g., at the Restore-_data pin in FIG. 1) can be buffered or daisy chained so that not all the cells restore at the same time.

Although the above-described power-cycling methods 3002, 4002, 5002 are not directly focused towards detecting structural faults within an SRPG cell 1002, some structural faults in the chip may also be detected. For example, if pin QB on the retention flop 1004 is stuck at a logic-0 value because of a manufacturing defect, it can be detected by structural tests generated by an automatic test pattern generator. But this defect can also be detected by these power-cycling methods since the defect would prevent a logic-1 value retained in the retention flop 1004 from being observable at the Q pin of the retention cell 1002. In some operational settings, a robust testing methodology for testing state retention logic may include structural testing of the SRPGs by using ATPG-generated patterns to catch gross defects, followed by application of power cycling based tests to ensure proper operation of the retention functionality.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

At least some values for the results of the method can be saved, either in memory (e.g., RAM (Random Access Memory)) or permanent storage (e.g., a hard-disk system) for later use. For example the loaded and unloaded patterns can be saved for later evaluation of the IC. Alternatively, some derivative or summary form of the results (e.g., results of individual or multiple tests) can be saved for later use according to the requirements of the operational setting.

At least some values for the results of the method can be saved, either in memory (e.g., RAM (Random Access Memory)) or permanent storage (e.g., a hard-disk system) for later use. For example the results from comparing the loaded and unloaded patterns can be saved directly for evaluating the IC. Alternatively, some derivative or summary form of the results (e.g., results of multiple tests, original loaded and unloaded strings, etc.) can be saved for later use according to the requirements of the operational setting.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method of testing an Integrated Circuit (IC), comprising:
    loading a sequence of data into a serial chain of circuit elements that includes scan flip flops or latches coupled in a serial scan chain such that the sequence of data is loaded into the serial scan chain of scan flip flops or latches that hold the data values, wherein
    outputs of at least some scan flip flops or latches are connected to inputs of adjacent scan flip flops or latches so values move sequentially through the serial scan chain between a scan chain input for loading values and a scan chain output for unloading values, and
    a first circuit element in the serial chain includes a retention flip flop or latch for saving a value during a power variation related to the IC that had been held in a scan flip flop or latch of the first circuit element prior to the power variation;
    saving a value from the data sequence in the retention flip flop or latch;
    accessing the retention flip flop or latch for verifying an accuracy of the saved value from the data sequence.

2. A method according to claim 1, wherein accessing the retention flip flop or latch includes using the retention flip flop or latch to restore a value for the first circuit element; and unloading values from the serial chain of circuit elements.

3. A method according to claim 1, further comprising: transitioning a portion of the IC to a power-off mode before accessing the retention flip flop or latch, wherein the portion of the IC includes the retention flip flop or latch.

4. A method according to claim 1, wherein the data sequence is a first data sequence and the method further comprises:
    loading a second sequence of data into the serial chain after saving the value in the retention flip flop or latch and before accessing the retention flip flop or latch, wherein the second data sequence includes a value for the retention flip flop or latch that is different from a corresponding value of the first data sequence.

5. A method according to claim 4, wherein
    each of the first and second sequences includes substantially uniform values for reducing a power consumption corresponding to the method.

6. A method according to claim 1, wherein the data sequence is a first data sequence and the method further comprises:
    loading a second sequence of data into the serial chain after accessing the retention flip flop or latch for verifying the accuracy of the saved value from the first data sequence, wherein the second data sequence includes a value for the retention flip flop or latch that is different from the saved value of the first data sequence;
    saving the different value from the second data sequence in the retention flip flop or latch; and
    accessing the retention flip flop or latch for verifying an accuracy of the saved different value from the second data sequence.

7. A method according to claim 6, wherein
    each of the first and second sequences includes substantially uniform values for reducing a power consumption corresponding to the method.

8. A method according to claim 1, wherein the retention element includes: a power source independent of the power variations related to the IC.

9. A method according to claim 1, wherein loading the sequence of data into the serial chain of circuit elements includes a set operation or reset operation for at least one circuit element.

10. A method according to claim 1, wherein a plurality of the circuit elements each include a retention flip flop or latch for saving values during power variations related to the IC, and the method further comprises:
    saving values from the data sequence in the retention flip flops or latches; and
    accessing the retention flip flops or latches for verifying an accuracy of the saved values from the data sequence.

11. An apparatus for testing an Integrated Circuit (IC), the apparatus comprising a computer for executing computer instructions, wherein the computer includes computer instructions for:
    loading a sequence of data into a serial chain of circuit elements that includes scan flip flops or latches coupled in a serial scan chain such that the sequence of data is loaded into the serial scan chain of scan flip flops or latches that hold the data values, wherein
    outputs of at least some scan flip flops or latches are connected to inputs of adjacent scan flip flops or latches so values move sequentially through the serial scan chain between a scan chain input for loading values and a scan chain output for unloading values, and
    a first circuit element includes a retention flip flop or latch for saving values during power variations related to the IC;
    saving a value from the data sequence in the retention flip flop or latch;
    accessing the retention flip flop or latch for verifying an accuracy of the saved value from the data sequence.

12. An apparatus according to claim 11, wherein the computer includes a processor with memory for executing at least some of the computer instructions.

13. An apparatus according to claim 11, wherein the computer includes circuitry for executing at least some of the computer instructions.

14. An apparatus according to claim 11, wherein the computer further includes computer instructions for: transitioning a portion of the IC to a power-off mode before accessing the retention flip flop or latch, wherein the portion of the IC includes the retention flip flop or latch.

15. An apparatus according to claim 11, wherein the data sequence is a first data sequence and the computer further includes computer instructions for:
loading a second sequence of data into the chain after saving the value in the retention flip flop or latch and before accessing the retention flip flop or latch, wherein the second data sequence includes a value for the retention flip flop or latch that is different from a corresponding value of the first data sequence.

16. An apparatus according to claim 11, wherein the data sequence is a first data sequence and the computer further includes computer instructions for:
loading a second sequence of data into the serial chain after accessing the retention flip flop or latch element for verifying the accuracy of the saved value from the first data sequence, wherein the second data sequence includes a value for the retention flip flop or latch that is different from the saved value of the first data sequence;
saving the different value from the second data sequence in the retention flip flop or latch; and
accessing the retention flip flop or latch for verifying an accuracy of the saved different value from the second data sequence.

17. A non-transitory computer-readable medium that stores a computer program for testing an Integrated Circuit (IC), wherein the computer program includes instructions for:
loading a sequence of data into a serial chain of circuit elements that includes scan flip flops or latches coupled in a serial scan chain such that the sequence of data is loaded into the serial scan chain of scan flip flops or latches that hold the data values, wherein
outputs of at least some scan flip flops or latches are connected to inputs of adjacent scan flip flops or latches so values move sequentially through the serial scan chain between a scan chain input for loading values and a scan chain output for unloading values, and
a first circuit element in the serial chain includes a retention flip flop or latch for saving a value during a power variation related to the IC that had been held in a scan flip flop or latch of the first circuit element prior to the power variation;
saving a value from the data sequence in the retention flip flop or latch;
accessing the retention flip flop or latch for verifying an accuracy of the saved value from the data sequence.

18. A non-transitory computer-readable medium according to claim 17, wherein the computer program further includes instructions for: transitioning a portion of the IC to a power-off mode before accessing the retention flip flop or latch, wherein the portion of the IC includes the retention element.

19. A non-transitory computer-readable medium according to claim 17, wherein the data sequence is a first data sequence and the computer program further includes instructions for:
loading a second sequence of data into the serial chain after saving the value in the retention flip flop or latch and before accessing the retention flip flop or latch, wherein the second data sequence includes a value for the retention flip flop or latch that is different from a corresponding value of the first data sequence.

20. A non-transitory computer-readable medium according to claim 17 wherein the data sequence is a first data sequence and the computer program further includes instructions for:
loading a second sequence of data into the serial chain after accessing the retention flip flop or latch for verifying the accuracy of the saved value from the first data sequence, wherein the second data sequence includes a value for the retention flip flop or latch that is different from the saved value of the first data sequence;
saving the different value from the second data sequence in the retention flip flop or latch; and
accessing the retention flip flop or latch for verifying an accuracy of the saved different value from the second data sequence.

21. A method of testing an Integrated Circuit (IC) that includes multiple power domains, comprising:
loading a sequence of data into a serial chain of circuit elements that includes scan flip flops or latches coupled in a serial scan chain such that the sequence of data is loaded into the serial scan chain of scan flip flops or latches that hold the data values,
wherein outputs of at least some scan flip flops or latches are connected to inputs of adjacent scan flip flops or latches so values move sequentially through the serial scan chain between a scan chain input for loading values and a scan chain output for unloading values, and
wherein a first circuit element in the serial chain includes a retention flip flop or latch for saving values during power-off of the first power domain;
transitioning the first power domain to a power-off mode while at least one other power domain is powered-on;
saving a value from the data sequence in the retention flip flop or latch when the first power domain is powered-off;
performing power cycling while the first power domain is powered-off and at least one other power domain is powered-on;
transitioning the first power domain to a power-on mode;
accessing the retention flip flop or latch when the first power domain is powered on to restore a value for the first circuit element; and
unloading values from the serial chain of circuit elements to verify an accuracy of the saved value from the data sequence.

22. An apparatus for testing an Integrated Circuit (IC) that includes multiple power domains , the apparatus comprising a computer for executing computer instructions, wherein the computer includes computer instructions for:
loading a sequence of data into a serial chain of circuit elements that includes scan flip flops or latches coupled in a serial scan chain such that the sequence of data is loaded into the serial scan chain of scan flip flops or latches that hold the data values,
wherein outputs of at least some scan flip flops or latches are connected to inputs of adjacent scan flip flops or latches so values move sequentially through the serial scan chain between a scan chain input for loading values and a scan chain output for unloading values, and
wherein a first circuit element in the serial chain includes a retention flip flop or latch for saving values during power-off of the first power domain;
transitioning the first power domain to a power-off mode while at least one other power domain is powered-on;
saving a value from the data sequence in the retention flip flop or latch when the first power domain is powered-off;

performing power cycling while the first power domain is powered-off and at least one other power domain is powered-on;

transitioning the first power domain to a power-on mode;

accessing the retention flip flop or latch when the first power domain is powered on to restore a value for the first circuit element; and unloading values from the serial chain of circuit elements to verify an accuracy of the saved value from the data sequence.

23. A non-transitory computer-readable medium that stores a computer program for testing an Integrated Circuit (IC) that includes multiple power domains, wherein the computer program includes instructions for:

loading a sequence of data into a serial chain of circuit elements that includes scan flip flops or latches coupled in a serial scan chain such that the sequence of data is loaded into the serial scan chain of scan flip flops or latches that hold the data values, wherein outputs of at least some scan flip flops or latches are connected to inputs of adjacent scan flip flops or latches so values move sequentially through the serial scan chain between a scan chain input for loading values and a scan chain output for unloading values, and wherein a first circuit element in the serial chain includes a retention flip flop or latch for saving values during power-off of the first power domain;

transitioning the first power domain to a power-off mode while at least one other power domain is powered-on;

saving a value from the data sequence in the retention flip flop or latch when the first power domain is powered-off;

performing power cycling while the first power domain is powered-off and at least one other power domain is powered-on;

transitioning the first power domain to a power-on mode;

accessing the retention flip flop or latch when the first power domain is powered on to restore a value for the first circuit element; and unloading values from the serial chain of circuit elements to verify an accuracy of the saved value from the data sequence.

* * * * *